(12) United States Patent  
Saito

(10) Patent No.: US 6,493,660 B2
(45) Date of Patent: Dec. 10, 2002

(54) DELAY TIME CALCULATING METHOD FOR USE IN HIERARCHICAL DESIGN

(75) Inventor: Wataru Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 49 days.

(21) Appl. No.: 09/828,778

(22) Filed: Apr. 10, 2001

(65) Prior Publication Data

US 2001/0029598 A1 Oct. 11, 2001

(30) Foreign Application Priority Data

Apr. 10, 2000 (JP) ........................................ 2000-108604

(51) Int. Cl.[7] .............................................. G06F 17/50
(52) U.S. Cl. ............................................ 703/19; 716/6
(58) Field of Search ............................ 703/14, 18, 19; 716/6; 364/490, 488, 489, 578

(56) References Cited

U.S. PATENT DOCUMENTS

| | | | | |
|---|---|---|---|---|
| 5,629,860 A | * | 5/1997 | Jones et al. ...................... | 716/6 |
| 5,715,170 A | * | 2/1998 | Nakamori ...................... | 703/15 |
| 5,847,966 A | * | 12/1998 | Uchino et al. .................. | 716/2 |
| 6,066,177 A | * | 5/2000 | Hatsuda ........................ | 703/14 |

* cited by examiner

*Primary Examiner*—Don Wong
*Assistant Examiner*—Chuc Tran D

(74) *Attorney, Agent, or Firm*—McGinn & Gibb, PLLC

(57) ABSTRACT

There is provided a delay time calculating method for use in a hierarchical design, capable of accurately calculating the delay amount at a boundary between different level layers in a hierarchical structure. A whole chain (T$01 to T$13) is divided into a first partial chain (T$04 to T$10) and a second partial chain (T$01 to T$03, T$11 to T$13). A first delay amount (TD(4–10)) of the first partial chain (T$04 to T$10) is calculated. A third partial chain (T$01 to T$05, T$09 to T$13) consisting of the second partial chain (T$01 to T$03, T$11 to T$13) and a plurality of chain elements (T$04 to T$05, T$09 to T$10) included in an end region of the first partial chain (T$04 to T$10), is generated, and a second delay amount (TD(1–5), TD(9–13)) of the third partial chain (T$01 to T$05, T$09 to T$13) is calculated. An end chain element (T$05, T$09) of the above mentioned plurality of chain elements (T$04 to T$05, T$09 to T$10) is separated from the third partial chain (T$01 to T$05, T$09 to T$13), and a third delay amount (D(5), D(9)) of the end chain element (T$05, T$09) is calculated. The third delay amount (D(5), D(9)) is subtracted from the second delay amount (TD(1–5), TD(9–13)) to obtain a fourth delay amount (TD(1–4), TD(10–13)). The fourth delay amount (TD(1–4), TD(10–13)) is overwritten to the first delay amount (TD(4–10)) in units of chain elements to calculate the delay amount (TD(1–13)) of the whole chain. Thus, an inaccurate value is canceled, so that an accurate relation between the delay amount of a partial chain and the delay amount of the whole chain can be obtained.

4 Claims, 4 Drawing Sheets

DELAY TIME CALCULATING METHOD FOR USE IN HIERARCHICAL DESIGN

BACKGROUND OF THE INVENTION

The present invention relates to a delay time calculating method for use in a hierarchical design, and more specifically to a delay time calculating method for use in a hierarchical design, capable of accurately calculating the relation between the delay amount of a partial chain and the delay amount of a whole chain.

In a circuit design, a delay of a partial buffer chain of chained buffers is calculated. In comparison with the whole of the chained buffers, the partial buffer chain is considered to be a low level layer in a hierarchical design. The delay time calculating method for use in the hierarchical design is known as shown in FIG. 5, in which the reference signs T$01 to T$13 designate buffers, respectively. In the example shown in FIG. 5, a "0"th level layer, that is the whole of the chained buffers T$01 to T$13, is called a top layer or an upper level layer. From the top layer, a partial buffer chain, that is a part of the whole, is cut out as a "Macro A". This "Macro A" is called a low level layer or a first level layer. The remaining top layer is constituted of a partial chain consisting of the buffers T$01 to T$3, and another partial chain consisting of the buffers T$11 to T$13. The "Macro A" is constituted of still another partial chain consisting of the buffers T$4 to T$10.

In accordance with a prior delay time calculating method for the above mentioned hierarchical structure, the delay of the "Macro A" constituted of the chained buffers T$4 to T$10 is calculated, and the obtained delay amount is annotated as a first annotation (Step S1) Then, the delay of the top layer constituted of the buffers T$01 to T$3 and T$11 to T$13 is calculated, and the obtained delay amount is annotated as a second annotation (Step S2). Finally, the sum of the first annotation and the second annotation is calculated, so that the delay amount of the whole is obtained.

In this calculation, however, the existence of delay influence factors "Cload" and "Trf" shown in FIG. 4 is disregarded. FIG. 4 shows some number of chained (or cascaded) buffers I$01 to I$03 for illustrating the delay influence factors existing between each pair of adjacent buffers in the buffer chain. The delay influence factors "Cload" and "Trf" are a delay factor such as a dull of a waveform appearing when a voltage waveform inputted to or outputted from a circuit element is delayed because of the influence of the circuit element concerned and/or a preceding or succeeding circuit element. Precisely considering the delay time of a middle buffer I$02, the delay time of a middle buffer I$02 is influenced by the delay influence factors "Cload" and "Trf" generated between the preceding buffer I$01 and the buffer I$02 when an input of the buffer I$02 is connected to an output of the buffer I$01 since the buffers I$01 and I$02 dynamically mutually influence each other, and the delay influence factor "Cload" generated between the buffer I$02 and the succeeding buffer I$03 when an output of the buffer I$02 is connected to an input of the buffer I$03 since the buffers I$02 and I$03 dynamically mutually influence each other. At the buffers at a boundary (node "a" and "b") between the "Macro A" and the top layer, namely, at the buffer at a boundary of each of partial chains obtained by cutting out the buffer chain, these delay influence factors are not added in the delay calculation, and therefore, a delay amount caused by these delay influence factors is not propagated to a next buffer. As a result, an I/O path interconnection based on the delay influence (called an "inter-related delay" hereinafter) is not calculated, and accordingly, a correct delay value is not obtained at a boundary between different level layers in the hierarchical structure.

Therefore, it is demanded to calculate the correct delay value at a boundary between different level layers in the hierarchical structure.

BRIEF SUMMARY OF THE INVENTION

Accordingly, it is an object of the present invention to provide a delay time calculating method for use in a hierarchical design, capable of calculating the correct delay value at a boundary between different level layers in the hierarchical structure.

In order to achieve the above and other objects of the present invention, the following delay time calculating method for use in a hierarchical design is provided in accordance with the present invention. In the following delay time calculating method in accordance with the present invention for use in a hierarchical design, the parenthesized reference signs corresponds to reference signs given in one or more embodiments of the present invention which will be described later with reference to the drawings, and added only for clarifying the relation between technical matters recited in the delay time calculating method in accordance with the present invention and constituents in the one or more embodiments of the present invention. Therefore, it should be noted that the parenthesized reference signs never limit the claimed invention to the embodiments of the present invention which will be described later with reference to the drawings.

According to the present invention, there is provided a delay time calculating method for use in a hierarchical design, the method comprising the steps of dividing a whole chain (T$01 to T$13) to generate a first partial chain (T$04 to T$ 10) and a second partial chain (T$01 to T$03, T$11 to T$13), calculating a first delay amount (TD(4–10)) of the first partial chain (T$04 to T$10), generating a third partial chain (T$01 to T$05, T$09 to T$13) consisting of the second partial chain (T$01 to T$03, T$11 to T$13) and a plurality of chain elements (T$04 to T$05, T$09 to T$10) included in an end region of the first partial chain (T$04 to T$10), calculating a second delay amount (TD(1–5), TD(9–13)) of the third partial chain (T$01 to T$05, T$09 to T$13), separating an end chain element (T$05, T$09) of the above mentioned plurality of chain elements (T$04 to T$05, T$09 to T$10) from the third partial chain (T$01 to T$05, T$09 to T$13) to calculate a third delay amount (D(5), D(9)) of the end chain element (T$05, T$09), subtracting the third delay amount (D(5), D(9)) from the second delay amount (TD (1–5), TD(9–13)) to obtain a fourth delay amount (TD(1–4), TD(10–13)), and overwriting the fourth delay amount (TD (1–4), TD(10–13)) to the first delay amount (TD(4–10)) in units of chain elements to calculate the delay amount (TD(1–13)) of the whole chain.

The calculation of the second delay amount (TD(1–5), TD(9–13)) is not accurate in connection with the calculation of the delay amount of the end chain element (T$05, T$09) of the above mentioned plurality of chain elements (T$04 to T$05, T$09 to T$10) included in the third partial chain (T$01 to T$05, T$09 to T$13). However, the fourth delay amount (TD(1–4), TD(10–13)) is accurate since it is obtained by subtracting from the second delay amount (TD(1–5), TD(9–13)) the third delay amount (D(5), D(9)), which is the delay time of the end chain element (T$05, T$09) of the above mentioned plurality of chain elements (T$04 to T$05, T$09 to T$10) included in the third partial chain (T$01 to T$05, T$09 to T$13). Furthermore, the delay amount of the end region (T$04, T$10) of the first partial chain (T$04 to T$10) is also not accurate. However, this inaccuracy is removed by overwriting the fourth delay amount (TD(1–4), TD(10–13)) to the first delay amount (TD(4–10)) in units of chain elements. Thus, the accurate delay amount (TD(1–13)) of the whole chain can be obtained, and in the whole chain, the delay amount of the partial chain can be accurately obtained. The delay amount of the partial chain thus obtained can be utilized any times in the course of a simulation. In particular, the fourth delay amount of the partial chain can be utilized any time for the overwriting.

In the above mentioned method, the end chain element of the plurality of chain elements included in the end region of the first partial chain may be a plurality of end chain elements (T$05 to T$06, T$08 to T$09) of at least three chain elements (T$04 to T$06, T$08 to T$10) included in the end region of the first partial chain. This pluralization is effective in elevating the degree of accuracy in the calculation of the delay amount.

Both of the first partial chain and the second partial chain are part of the whole chain. The whole chain is constituted of the first partial chain and the second partial chain, regardless of how the upper level layer and the lower level layer is defined in the hierarchical structure. Accordingly, the first partial chain may be either a cut-out part or the remaining part as the result of the cutting-out.

According to another aspect of the present invention, there is provided a delay time calculating method for use in a hierarchical design, the method comprising the steps of generating a first partial chain (T$04 to T$10 or T$01 to T$05) and a second partial chain (T$01 to T$05 or T$04 to T$10) from a whole chain (T$01 to T$13), each of the first partial chain and the second partial chain having an overlapping end region which includes a plurality of chain elements (T$04 to T$05) also included in an overlapping end region of the other partial chain, calculating a first delay amount (TD(4–10) or TD(1–5)) of the first partial chain and a second delay amount (TD(1–5) or TD(4–10)) of the second partial chain, separating an end chain element (T$05 or T$04) included in the overlapping end region from the second partial chain, calculating a third delay amount (D(5) or D(4)) of the separated end chain element (T$05 or T$04), subtracting the third delay amount (D(5) or D(4)) from the second delay amount (TD(1–5) or TD(4–10)) to obtain a fourth delay amount (TD(1–4) or TD(5–10)), and overwriting the fourth delay amount (TD(1–4) or TD(5–10)) to the first delay amount (TD(4–10) or TD(1–5)) in units of chain elements. Here, the overwriting is executed in the chain elements in the overlapping portion excluding the cut-out chain element.

Also in the above mentioned method in accordance with the second aspect of the present invention, the overlapping end region of each of the first partial chain and the second partial chain can include at least three chain elements, and a plurality of chain elements included in the overlapping end region can be separated from the second partial chain. This pluralization is effective in elevating the degree of accuracy in the calculation of the delay amount.

The above and other objects, features and advantages of the present invention will be apparent from the following description of preferred embodiments of the invention with reference to the accompanying drawings.

DETAILED DESCRIPTION OF THE INVENTION

Now, embodiments of the delay time calculating method in accordance with the present invention for use in a hierarchical design will be described with reference to the accompanying drawings, in the case that the delay of the whole chain composed of a substantial number of chained buffers is calculated by dividing the whole chain by means of a cutting-out of a partial chain from the whole chain.

Here, referring back to FIG. 4 before explaining embodiments of the delay time calculating method in accordance with the present invention for use in a hierarchical design, the inventor found out that, of the two delay influence factors "Cload" and "Trf" generated between the preceding buffer I$01 and the buffer I$02, the degree of influence of the delay influence factor "Cload" to the delay time of the buffer IS02 is considerably smaller than the degree of influence of delay influence factor "Trf" to the delay time of the buffer IS02. In addition, the inventor found out that if the delay influence factor "Trf" generated between the preceding buffer I$01 and the delay influence factor "Cload" generated between the buffer I$02 and the succeeding buffer I$03 are considered in calculating the delay time of a middle buffer I$02, it is possible to obtain a practically acceptable degree of accuracy in the delay time of the middle buffer I$02. Therefore, first and second embodiments, which will be explained in the following, are based on this recognition.

Figure 1:
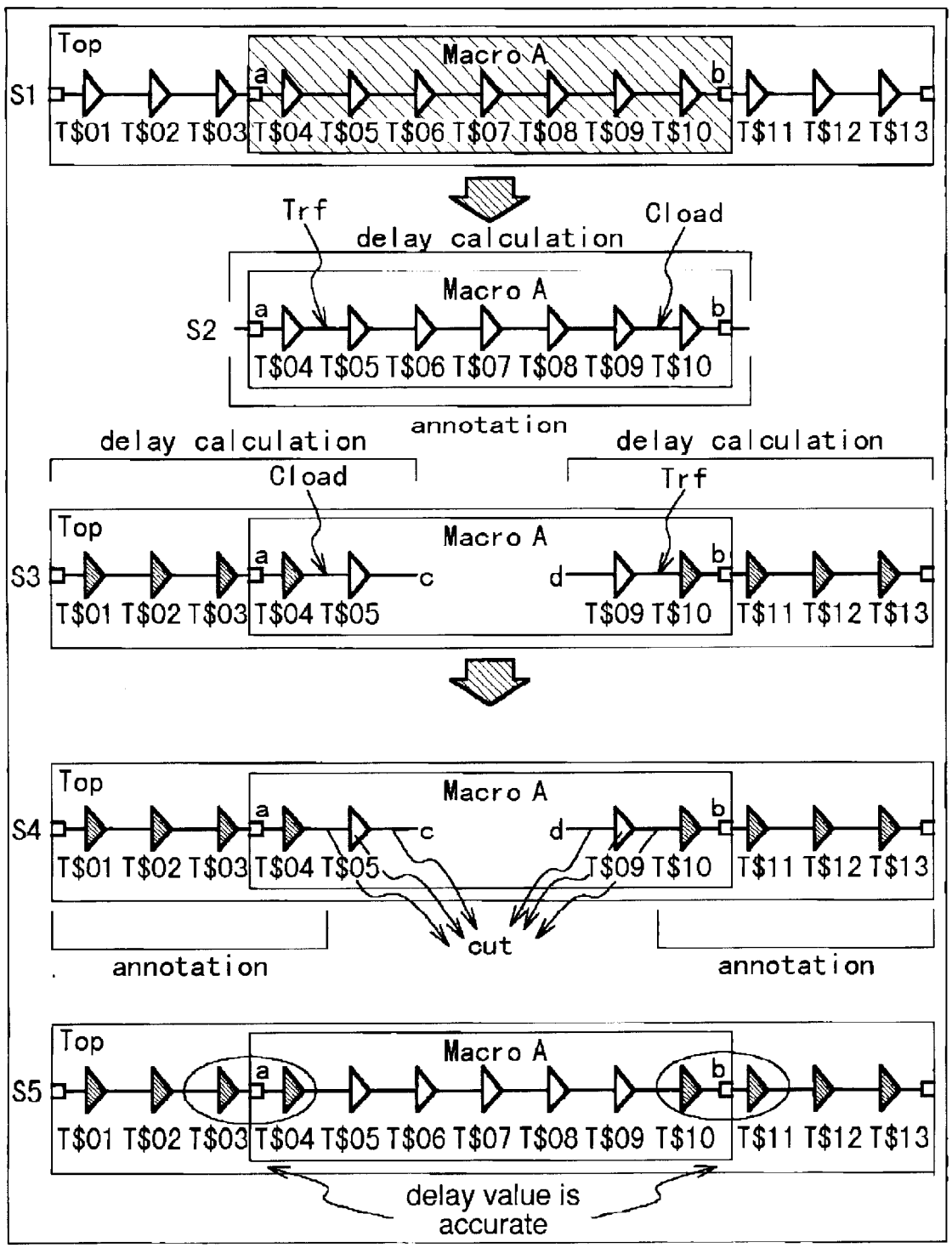
FIG. 1 is a circuit diagram for illustrating an embodiment of the delay time calculating method in accordance with the present invention for use in a hierarchical design.

Referring to FIG. 1, there is shown a circuit diagram for illustrating an embodiment of the delay time calculating method in accordance with the present invention for use in a hierarchical design.

As shown in FIG. 1, the whole chain is constituted of 13 buffers T$01 to T$13 cascaded in series to form a buffer chain. The whole chain T$01 to T$13 includes a "Macro A" which is composed of seven chained buffers T$04 to T$10, and which is a partial chain. The remaining portion, which remains after the "Macro A" (buffers T$04 to T$10) is cut out from the whole chain T$01–T$13, is included in a top layer in a hierarchical structure. The top layer is called an upper level layer, and the "Macro A" is called a lower level layer.

A propagating direction of a voltage signal is the direction from the buffer T$01 toward the buffer T$13 in the buffer chain. This propagating direction is called a forward direction in this specification. The time from the moment a pulse signal is applied to an input of the buffer T$01 to the moment the pulse signal is outputted from an output of the buffer T$01 is defined to be the delay time of the buffer T$01, and the amount of this delay time is expressed as D1 in this specification. The time from the moment the pulse signal outputted from an output of the buffer T$12 is applied to an input of the buffer T$13 to the moment the pulse signal is outputted from an output of the buffer T$13 is defined to be the delay time of the buffer T$13, and the amount of this delay time is expressed as D13 in this specification. Generally, the time from the moment the pulse signal outputted from an output of the buffer T$s-1 (where "s" is natural number) is applied to an input of the buffer T$s to the moment the pulse signal is outputted from an output of the buffer T$s is defined to be the delay time of the buffer T$s, and the amount of this delay time is expressed as Ds in this specification. In addition, the time from the moment the pulse signal is applied to an input of the buffer T$j to the moment the pulse signal is outputted from an output of the buffer T$k, (where "j" and "k" are natural number and where k>j), is defined to be the total delay time of a primitive T$j–T$k (composed of chained buffers T$j to T$k), and the amount of this delay time is expressed as TD(j–k) in this specification.

Step S1:

Physical information of the whole chain T$01–T$13 is inputted to a simulator constructed in a computer. This physical information includes physical parameters (for example, a resistance R and a capacitance C of a transistor, a resistance and a capacitance of a wiring conductor, etc.) of each of various circuit elements sufficient to calculate the delay amount between one buffer T$s and an adjacent succeeding buffer T$s+1 cascaded with the buffer T$s. A partial chain T$04–T$10 is cut out from the whole chain T$01–T$13 by dividing the whole chain at nodes "a" and "b" as shown in FIG. 1 As a result, in a hierarchical structure, a top layer corresponds to a first primitive T$01–T$03 and a second primitive T$11–T$13, and a "Marco A" corresponds to a primitive T$04–T$10.

Step S2

The first primitive T$01–T$03 and the second primitive T$11–T$13, which are the top layer, are separated from each other by the cutting-out of the primitive T$04–T$10. The delay amount TD(4–10) of the primitive T$04–T$10, which is a partial chain of the whole chain, is calculated independently of the delay amount of the whole chain. The following calculation result of the delay amount TD(4–10) can be obtained as a net list:

$$TD(4-10)=D'(4)+D(5)+D(6)+D(7)+D(8)+D(9)+D'(10)$$

Here, the apostrophe-added delay amounts D'(4) and D'(10) are inaccurate in comparison with an actual delay amount in the case that the "Marco A" is not cut off and therefore is included in the whole chain, since this calculation disregards the delay influence factor "Trf" between the buffers T$03 and T$04 when the input of the buffer T$04 is actually connected to an output of the buffer T$03, and the delay influence factor "Cload" between the buffers T$10 and T$11 when the output of the buffer T$10 is actually connected to an input of the buffer T$11.

Thus, an annotation of the total delay amount TD(4–10) of the partial chain composed of the buffers T$04 to T$10 is executed. In this calculation, the delay influence factor "Trf" between the buffers T$04 and T$05 is considered in calculating the delay amount of the buffer T$05, and the delay influence factor "Cload" between the buffers T$9 and T$10 is considered in calculating the delay amount of the buffer T$9. Therefore, the delay amount of the buffer T$05 and the delay amount of the buffer T$09 are accurately calculated. Accordingly, the delay time TD(5–9) is an accurate value. On the other hand, since the delay amounts D'(4) and D'(10) are inaccurate, the total delay amount TD(4–10) is not accurate.

Step S3:

First two chained buffers T$04 and T$05 and final two chained buffers T$09 and T$10 of the "Marco A" T$04–T$10 are cut off. The buffers T$04 and T$05 thus cut off are serially coupled to the first primitive T$01–T$03 which is the top layer, to form chained buffers T$01 to T$05. The buffers T$09 and T$10 thus cut off are serially coupled to the second primitive T$11–T$13 which is the top layer, to form chained buffers T$09 to T$13. Thus, two new partial chains are formed, which are called a third primitive T$01–T$05 and a fourth primitive T$09–T$13, respectively. The delay amounts TD(1–5) and TD(9–13) of these primitives are calculated independently of the delay amount of the whole chain, The following calculation results can be obtained as a net list:

$$TD(1-5)=D(1)+D(2)+D(3)+D(4)+D'(5)$$

$$TD(9-13)=D'(9)+D(10)+D(12)+D(12)+D(13)$$

In this calculation result, the apostrophe-added delay amounts D'(5) and D'(9) are inaccurate, differently from the D(5) and D(9) included in the delay time TD(4–10) obtained in the previous step S2 in connection with the "Marco A".

Step S4:

A final buffer T$05 of the third primitive T$01–T$05 and a first buffer T$09 of the fourth primitive T$09–T$13 are cut off from the calculation results TD(1–5) and TD(9–13) obtained in the Step S3. As the result of this cutting-off, an interrelated delay between the buffers T$04 and T$05, an interrelated delay between the buffer T$05 and a node "c", an interrelated delay between a node "d" and the buffer T$09, and an interrelated delay between the buffers T$09 and T$10, are deleted, and also, respective I/O paths of the buffers T$05 and T$09 are deleted. Therefore, the calculation result obtained in the step S3 is modified as follows:

$$TD(1-4)=D(1)+D(2)+D(3)+D(4)$$

$$TD(10-13)=D(10)+D(11)+D(12)+D(13)$$

Saying from another viewpoint, in the above mentioned processing, by cutting off the buffer T$05, it becomes possible to know the delay influence factor "Cload" attributable to the buffer T$05, influencing the buffer T$04. In addition, by cutting off the buffer T$09, it becomes possible to know the delay influence factor "Trf" attributable to the buffer T$09, influencing the buffer T$10.

Therefore, in the delay amount TD(1–5) of the third primitive T$11–T$05 obtained in the step S3, unitary delay amounts D(1), D(2), D(3) and D(4) are accurate values, since the influence of the delay influence factors "Cload" and "Trf" are considered in the calculation for obtaining the delay amount of each of the buffers T$01 to T$04. Similarly, in the delay amount TD(9–13) of the third primitive T$09–T$13 obtained in the step S3, unitary delay amounts D(10), D(11), D(12) and D(13) are accurate values, since the influence of the delay influence factors "Cload" and "Trf" are considered in the calculation for obtaining the delay amount of each of the buffers T$110 to T$13.

Accordingly, the delay amounts TD(1–4) and TD(10–13) thus obtained are accurate. Annotation of the delay amounts TD(1–4) and TD(10–13) is executed.

Step S5:

Then, the annotated delay amounts TD(1–4) and TD(10–13) are added to the annotated delay amount TD(4–10) as follows:

$$\frac{\begin{array}{c}D'(4)+D(5)+D(6)+D(7)+D(8)+D(9)+D'(10)+)\\D(1)+D(2)+D(3)+D(4)\\D(10)+D(11)+D(12)+D(13)\end{array}}{\begin{array}{c}D(1)+D(2)+D(3)+D(4)+D(5)+D(6)+D(7)+D(8)+\\D(9)+D(10)+D(11)+D(12)+D(13)\end{array}}$$

In this calculation, the addition of D(4) to D'(4) does not means a mathematical addition {D'(4)+D(4)}. In the present invention, the addition of D(n) to D'(n) (where "n" is natural number) means that D(n) is overwritten to a register or cells storing D'(n) so that D(n) is substituted for D'(n). Namely, D'(n) is deleted. Accordingly, the addition of D(4) to D'(4) becomes D(4). As a result, a correct annotation is executed.

Thus, according to the calculating method as mentioned above, when a delay calculation is carried out for a large scaled circuit, the result of a former delay calculation can be simply utilized. In addition, the delay amount of different primitives are simultaneously calculated in parallel by different computers provided for different level layers, respectively, with the result that TAT (turn around time) can be shortened.

Figure 2:
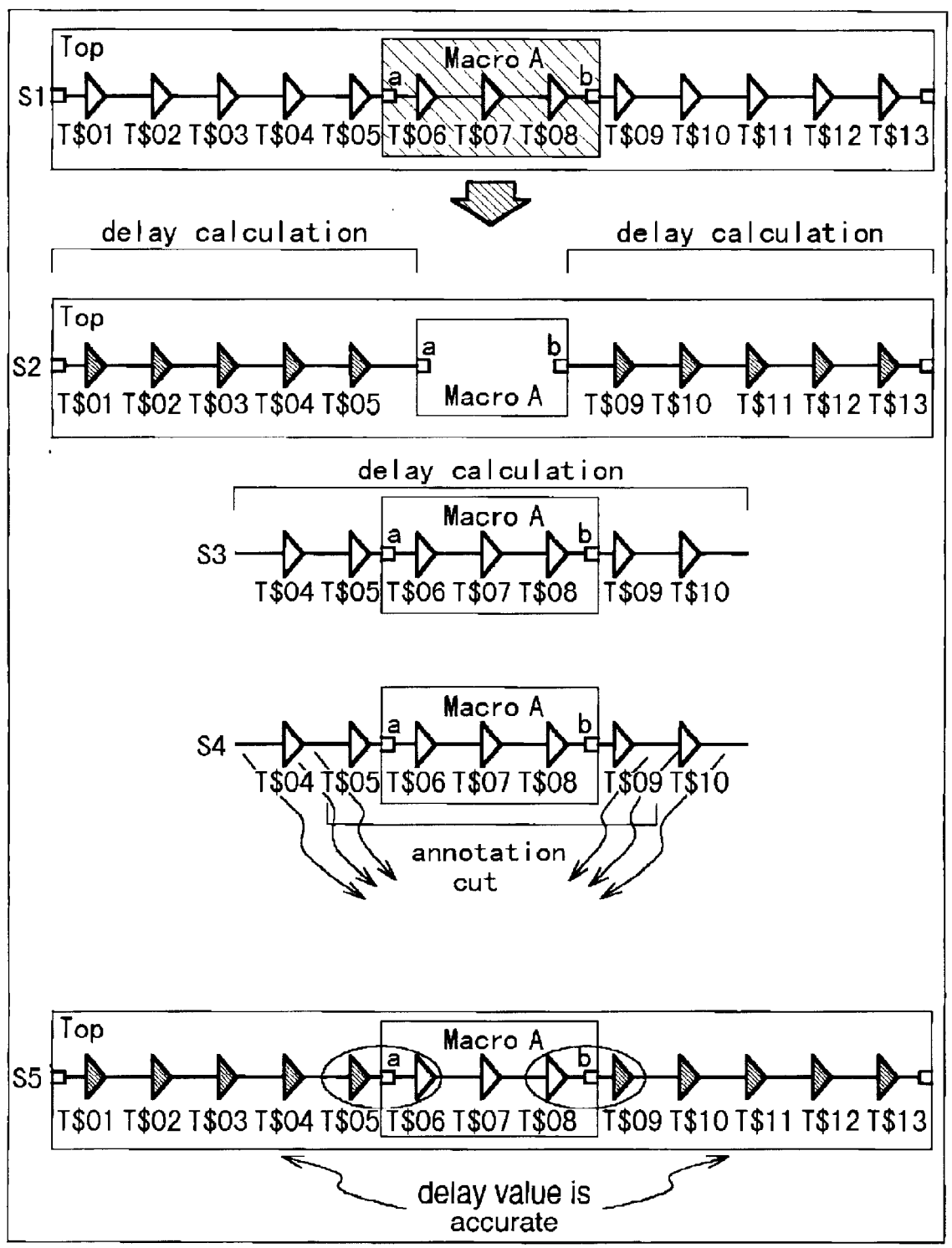
FIG. 2 is a circuit diagram for illustrating another embodiment of the delay time calculating method in accordance with the present invention for use in a hierarchical design.

Referring to FIG. 2, there is shown a circuit diagram for illustrating another embodiment of the delay time calculating method in accordance with the present invention for use in a hierarchical design. In FIG. 2, elements similar to those shown in FIG. 1 are given the same reference signs.

Step S1:

The whole chain is divided into a top layer composed of a partial chain T$01–T$05 and another partial chain T$09–T$13, and a "Marco A" (which is a lower level layer) composed of still another partial chain T$06–T$08.

Step S2:

The top layer composed of the partial chain T$01–T$05 and the partial chain T$09–T$13 is cut out from the whole chain. Therefore, this second embodiment is different from the other embodiments in that the top layer is cut out. The delay amount TD(1–5) of the partial chain T$01–T$05 and the delay amount TD(9–13) of the partial chain T$09–T$13 are calculated.

Step S3:

A primitive T$04–T$10, which is a partial chain composed of the "Marco A" T$06–T$08, final two chained buffers T$04 and T$05 of the partial chain T$01–T$05 in the top layer, and first two chained buffers T$09 and T$10 of the partial chain T$09–T$13 in the top layer, is cut out. Then, the delay amount TD(4–10) of the primitive T$04–T$10 is calculated.

Step S4:

The buffers T$04 and T$10 at opposite ends of the primitive T$04–T$10 are deleted to form a new primitive T$05–T$9, and on the other hand, respective delay amounts D(4) and D(10) of the buffers T$04 and T$10 are calculated. The delay amounts D(4) and D(10) are subtracted from the delay amount TD(4–10), so that a delay amount of a new primitive T$05–T$9 is obtained. Thus, an annotation of the primitive T$05–T$9 is carried out.

Step S5:

Then, the annotated delay amount TD(5–9) is added to the annotated delay amounts TD(1–5) and TD(9–13) of the partial chain T$01–T$05 and the partial chain T$09–T$13, which are the top layer. Namely, the following calculation is carried out:

$$TD(1-13)=TD(1-5)+TD(5-9)+TD(9-13)$$

In this calculation, D(5) and D(9) of TD(5–9) are overwritten to D(5) of TD(1–5) and D(9) of TD(9–13), respectively. Thus, an accurate delay amount TD(1–13) can be obtained.

As seen from the above, this second embodiment can exert an advantage similar to that obtained in the first embodiment. In addition, the second embodiment can give a versatility of design. Particularly, the second embodiment can facilitate a top-down design.

Figure 3:
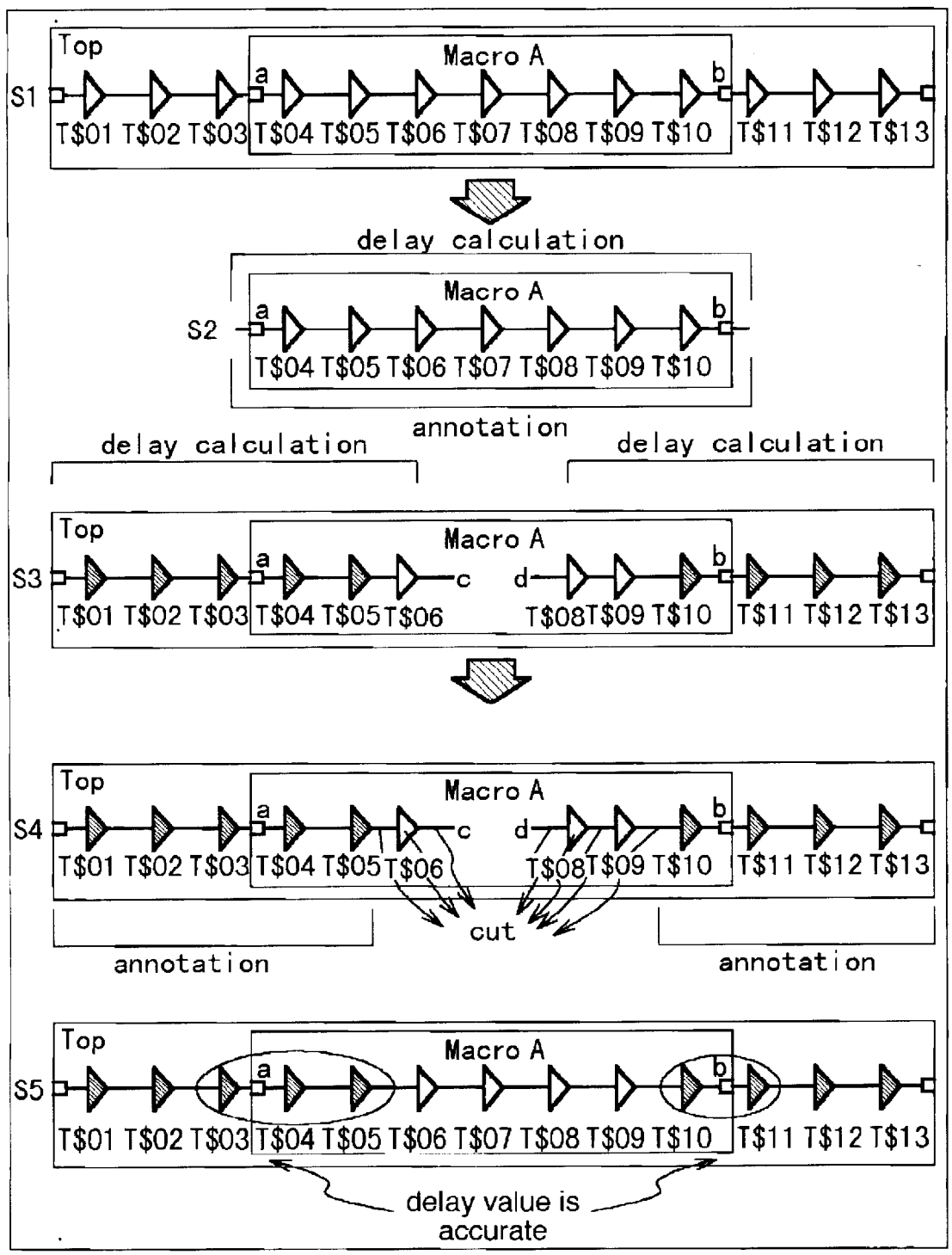
FIG. 3 is a circuit diagram for illustrating still another embodiment of the delay time calculating method in accordance with the present invention for use in a hierarchical design.

Referring to FIG. 3, there is shown a circuit diagram for illustrating still another embodiment of the delay time calculating method in accordance with the present invention for use in a hierarchical design. In FIG. 3, elements similar to those shown in FIG. 1 are given the same reference signs.

Here, referring back to FIG. 4, as mentioned above, if the delay time of the middle buffer I$02 is precisely considered, the delay time of a middle buffer I$02 is influenced by the two delay influence factors "Cload" and "Trf" generated between the preceding buffer I$01 and the buffer I$02 and the delay influence factor "Cload" generated between the buffer I$02 and the succeeding buffer I$03. In order to obtain a further accurate delay time, this third embodiment further considers the delay influence factor "Cload" generated between the preceding buffer I$01 and the buffer I$02.

Step S1:

A primitive T$01–T$03 and another primitive T$11–T$13 are selected as a top layer in a hierarchical structure. A partial chain T$04–T$10 is cut out as a lower level layer. Namely, the whole chain is divided into the top layer composed of the partial chain T$01–T$03 and the partial chain T$11–T$13, and a "Marco A" (lower level layer) composed of partial chain T$04–T$10.

Step S2:

The delay amount TD(4–10) of the partial chain T$04–T$10 cut out as the lower level layer is calculated. Thus, viewing the whole chain, a partial annotation is executed for the "Marco A".

Step S3:

A primitive T$01–T$06 composed of the primitive T$01–T$03 in the top layer and first three buffers T$04 to T$06 of the "Marco A" T$04–T$10, and another primitive T$08–T$13 composed of the primitive T$11–T$13 in the top layer and final three buffers T$08 to T$10 of the "Marco A" T$04–T$10, are cut out. The delay amount TD(1–6) of the primitive T$01–T$06 and the delay amount TD(8–13) of the primitive T$08–T$13 are calculated.

Step S4:

A final buffer T$06 is cut off from the primitive T$01–T$06, and first two buffers T$08 and T$09 are cut off from the primitive T$08–T$13, so that a new primitive T$01–T$05 and another new primitive T$10–T$13 are obtained. On the other hand, the delay times D(6), D(8) and D(9) of these cut-off buffers are calculated from the delay amount TD(1–6) and the delay amount TD(8–13). The delay times D(6), and D(8) and D(9) are subtracted from the delay amount TD(1–6) and the delay amount TD(8–13), respectively, so that the delay amounts TD(1–5) and TD(10–13) of the primitive T$01–T$05 and the primitive T$10–T$13 are obtained. Thus, an annotation is executed for the primitive T$01–T$05 and the primitive T$10–T$13.

Step S5:

Then, the annotated delay amounts TD(1–5) and TD(10–13) of the primitive T$01–T$05 and the primitive T$10–T$13 obtained in the step S4 are added to the annotated delay amounts TD(4–10) of the primitive T$04–T$10. Namely, the following calculation is carried out:

$$TD(1-13)=TD(1-5)+TD(4-10)+TD(10-13)$$

In this calculation, D(4) and D(5) of TD(1–5) and D(10) of TD(10–13) are overwritten to D(4), D(5) and D(10) of TD(4–10), respectively. Thus, an accurate delay amount TD(1–13) can be obtained.

Figure 4:
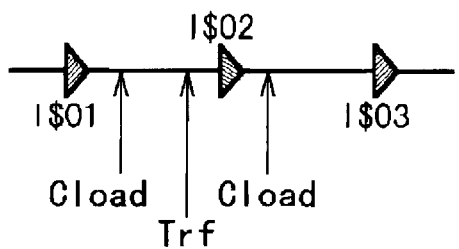
FIG. 4 is a circuit diagram for illustrating the analysis of a delay in chained buffers.
Figure 5:
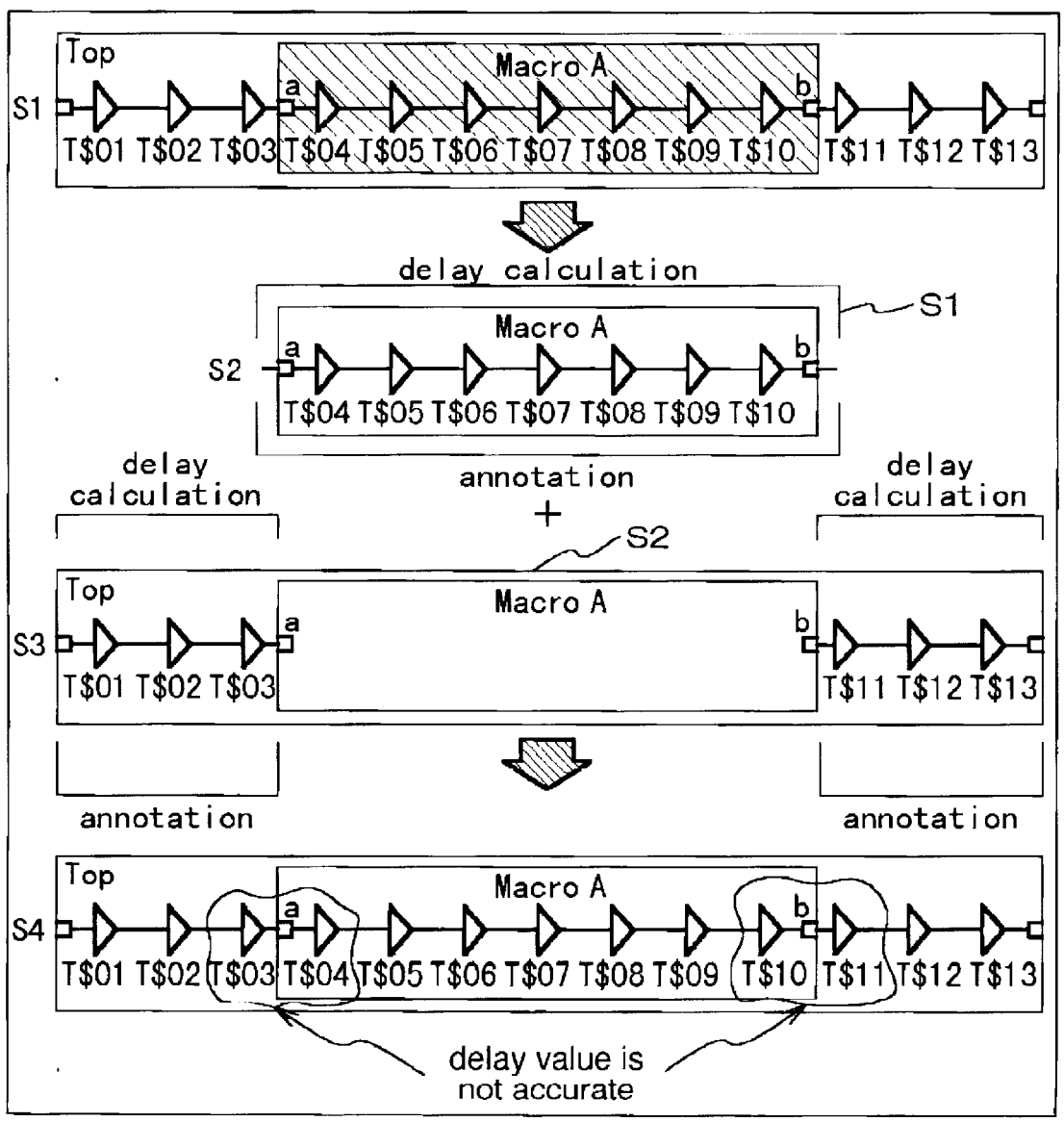
FIG. 5 is a circuit diagram illustrating a conventional delay time calculating method for use in a hierarchical design.

The delay amount TD(1–13) thus obtained is accurate since all the delay influence factors "Cload" and "Trf" shown in FIG. 4 are considered.

As mentioned above, in the diagram shown in FIG. 4, the delay amount of the buffer I$02 is influenced by only the delay influence factors "Cload" and "Trf" between the preceding buffer I$01 and the buffer I$02 and the delay influence factor "Cload" between the buffer I$02 and the succeeding buffer I$03. Therefore, if the delay influence factors "Cload" and "Trf" between the buffer I$01 and the buffer I$02 and the delay influence factor "Cload" between the buffer I$02 and the buffer I$03 are given and considered, the delay amount of the buffer I$02 can be accurately calculated.

In the delay time calculation of the "Marco A", in order to properly consider the delay influence factors "Cload" and "Trf" between the buffer T$05 and the buffer T$06, influencing the delay amount of the buffer T$06, since the delay influence factor "Cload" between the buffer T$05 and the buffer T$06 is influenced by not only the buffer T$05 but also the buffer T$04 located before the buffer T$05, it is necessary to totally consider the chained buffers T$04 to T$06. On the other hand, the delay influence factor "Cload" between the buffer T$09 and the buffer T$10, influencing the delay amount of the buffer T$09, is influenced by only the buffer T$10. Therefore, the delay time TD(6–9) is accurately calculated in the delay time calculation of the "Marco A".

Similarly, in the delay time calculation of the primitive T$08–T$13, in order to properly consider the delay influence factors "Cload" and "Trf" between the buffer T$09 and the buffer T$10, influencing the delay amount of the buffer T$10, since the delay influence factor "Cload" between the buffer T$09 and the buffer T$10 is influenced by not only the buffer T$09 but also the buffer T$08 located before the buffer T$09, it is necessary to totally consider the chained buffers T$08 to T$10. Therefore, the delay time TD(10–13) is accurately calculated in the delay time calculation of the primitive T$08–T$13. On the other hand, in the delay time calculation of the primitive T$01–T$06, the delay influence factor "Cload" between the buffer T$05 and the buffer T$06, influencing the delay amount of the buffer T$05, is influenced by only the buffer T$06. Therefore, the delay time TD(1–5) is accurately calculated in the delay time calculation of the primitive T$01–T$06. Accordingly, the buffer T$06 and the buffers T$08 and T$09 are cut off in the step S4, so that the accurate delay amounts TD(1–5) and TD(10–13) are obtained.

Thus, by overwriting D(4) and D(5) of TD(1–5) and D(10) of TD(10–13) to D(4), D(5) and D(10) of TD(4–10), respectively, the accurate delay amount TD(1–13) can be obtained.

As seen from the above, this third embodiment can exert an advantage similar to that obtained in the above mentioned embodiments. In addition, the third embodiment can comply with a quadratic function of an output table, so that the accuracy of a hierarchical delay calculation can be elevated.

In the above mentioned embodiments, the whole chain is divided into three partial chains However, if the whole chain is considered to be consist of the chained buffers T$01 to T$10 or T$04 to T$13, the delay time calculating method in accordance with the present invention in the case that the whole chain is divided into two partial chains, will be apparent to persons skilled in the art with no further explanation.

As seen from the above, since the delay time calculating method in accordance with the present invention for use in a hierarchical design accurately obtains the delay value at a boundary between different level layers in the hierarchical structure, it is possible to accurize the delay relation between the whole chain and a partial chain included in a different level layer, and therefore, it is possible to utilize an already calculated delay value in the process of the design.

The invention has thus been shown and described with reference to the specific embodiments. However, it should be noted that the present invention is in no way limited to the details of the illustrated structures but changes and modifications may be made within the scope of the appended claims.

What is claimed is:

1. A delay time calculating method for use in a hierarchical design, the method comprising the steps of:

dividing a whole chain to generate a first partial chain and a second partial chain;

calculating a first delay amount of said first partial chain;

generating a third partial chain consisting of said second partial chain and a plurality of chain elements included in an end region of said first partial chain;

calculating a second delay amount of said third partial chain;

separating an end chain element of said plurality of chain elements from said third partial chain to calculate a third delay amount of said end chain element;

subtracting said third delay amount from said second delay amount to obtain a fourth delay amount; and overwriting said fourth delay amount to said first delay amount in units of chain elements to calculate the delay amount of the whole chain.

2. A delay time calculating method claimed in claim 1 wherein said end chain element of said plurality of chain elements included in said end region of said first partial chain includes a plurality of end chain elements of at least three chain elements included in said end region of said first partial chain.

3. A delay time calculating method for use in a hierarchical design, the method comprising the steps of:

generating a first partial chain and a second partial chain from a whole chain, each of said first partial chain and said second partial chain having an overlapping end region which includes a plurality of chain elements also included in an end region of the other partial chain;

calculating a first delay amount of said first partial chain and a second delay amount of said second partial chain;

separating an end chain element included in said overlapping end region from said first partial chain;

calculating a third delay amount of the separated end chain element;

subtracting said third delay amount from said second delay amount to obtain a fourth delay amount; and overwriting said fourth delay amount to said first delay amount in units of chain elements.

4. A delay time calculating method claimed in claim 3 wherein said overlapping end region of each of said first partial chain and said second partial chain includes at least three chain elements, and a plurality of chain elements included in said overlapping end region can be separated from said second partial chain.

* * * * *